United States Patent [19]

Lee et al.

[11] Patent Number: 4,507,625
[45] Date of Patent: * Mar. 26, 1985

[54] SWITCHED CAPACITOR AM MODULATOR/DEMODULATOR

[75] Inventors: Man S. Lee, San Mateo; Chieh Chang, Belmont, both of Calif.

[73] Assignee: GTE Communications Systems Corporation, Phoenix, Ariz.

[ * ] Notice: The portion of the term of this patent subsequent to Mar. 12, 2002 has been disclaimed.

[21] Appl. No.: 392,972

[22] Filed: Jun. 28, 1982

[51] Int. Cl.$^3$ .......................... H03C 1/02; H03K 7/00
[52] U.S. Cl. .................. 332/31 R; 332/9 R; 332/45; 332/48; 329/163; 329/192
[58] Field of Search ............ 332/9 R, 9 T, 31 R, 332/31 T, 44, 45, 48, 49, 56; 329/101, 102, 109, 178, 192; 307/264, 352, 353; 455/46, 47, 108, 109, 202, 203, 204, 337; 375/24, 41, 43, 61, 37, 94; 333/15 B; 328/150, 151

[56] References Cited

U.S. PATENT DOCUMENTS 3,482,174 12/1969 James ............................ 329/178 X
3,944,852 3/1976 Gilbert ........................... 332/9 T X
4,375,625 3/1983 Lee .................................. 328/167 X

FOREIGN PATENT DOCUMENTS 3022252 12/1981 Fed. Rep. of Germany ...... 333/173

OTHER PUBLICATIONS

Martin K., "Switched Capacitor Building Blocks for Adaptive Systems", IEEE Transactions on Circuits and Systems, vol. CAS-S-28, No. 6, Jun. 1981, pp. 576–584.
Zomorrodi, M., "Switched Capacitor Quadrature N-Path Filters", Midwest Symposium on Circuits and Systems, Jun. 1981, pp. 682–686.
Chang C. et al., "Switched Capacitor Modem for Amplitude Modulation", IEEE International Symposium on Circuits and Systems Proceedings Rome, Italy, May 10, 1982, pp. 557–560.
Taub, H. et al., Principles of Communication Systems, McGraw Hill Book Co. 1971, pp. 102–104.

Primary Examiner—Eugene R. LaRoche
Assistant Examiner—D. C. Mis
Attorney, Agent, or Firm—Russell A. Cannon

[57] ABSTRACT

A first embodiment of an integrable switched capacitor modulator comprises a differential input operational amplifier A1 having a virtual ground potential impressed on its inverting input terminal; capacitors C1, C2 and C3; and switch means operative for alternately (1) charging C1 with an input voltage while connecting C2 and C3 in series with A1 and across it, respectively, for causing it to produce an inverted version of the input voltage, and (2) discharging C2 and C3 while connecting the sample of the input voltage on C1 across A1 for causing it to output a non-inverted sample of the input voltage. The modulated output signal from A1 is preferably bandpass filtered to eliminate baseband spectral components fed through A1 when C2 is connected in series with the input terminal thereof. In a second embodiment which is insensitive to feedthrough and which requires only two capacitors C1 and C4, the switch means alternately (1) charges C1 with the input voltage while connecting a prior sample of the input voltage on C4 across A1 for causing it to output an inverted sample of the input voltage, and (2) charges C4 with the input signal while connecting the sample of the input voltage on C1 across A1 in the opposite polarity for causing it to output a non-inverted sample of the input voltage. This embodiment has particular advantage as a demodulator since the built-in sample-and-hold function provides low pass filtering of the output signal of A1.

10 Claims, 2 Drawing Figures

• = TOP PLATE

SWITCHED CAPACITOR AM MODULATOR/DEMODULATOR

BACKGROUND OF THE INVENTION

This invention relates to switched capacitor circuits and more particularly to switched capacitor circuits that are capable of performing modulation and/or demodulation functions.

Advances in MOS-LSI technologies and the development of switched capacitor techniques have improved the possibility of analog signal processing being done on a single chip. In order to perform such analog signal processing in a fully integrated circuit, however, circuits performing modulation and demodulation functions must be included. Modulators and demodulators have historically employed resistors. It is desirable to achieve these functions in integrated circuits without using resistors, however, since integrated resistors require a considerable surface area of the associated semiconductor chip. A switched capacitor demodulator which does not require resistors is disclosed in the article Switched-Capacitor Building Blocks for Adaptive Systems by K. Martin and A. S. Sedra, IEEE Transactions on Circuits and Systems, Vol. CAS-28, No. 6, June 1981, pp. 576-584. Martin's demodulator comprises a switched capacitor low-pass filter with a switched input signal, see Section VI, pp. 580-581, and FIGS. 11 and 12 there. Switched capacitor modulators and demodulators are also illustrated and briefly described in the article Switched-Capacitor Quadrature N-Path Filters by M. Zomorrodi, Midwest Symposium on Circuits and Systems, pp. 682-686, June 1981, University of New Mexico. The operation and structure of circuits disclosed in FIG. 3 of this article require a 4-phase clock, and are relatively complex.

An object of this invention is the provision of resistorless circuitry for performing modulation and/or demodulation functions. Another object is the provision of improved switched capacitor circuits for performing modulation and/or demodulation functions.

SUMMARY OF THE INVENTION

In accordance with the invention, an integrable switched capacitor circuit capable of performing an amplitude modulation and/or demodulation function, comprises: an operational amplifier having an input terminal and an output terminal; first second and third capacitors C1, C2 and C3; and switch means alternately operative and in first and second non-overlapping switch states which are closed conditions of switching for alternately charging C1 with an input voltage while electrically connecting C2 between the input voltage and the input terminal and connecting C3 as a feedback capacitor across the amplifier for causing the later to produce on the output terminal an inverted-continuous version of the input signal throughout the first switch state; and electrically discharging C2 and C3 while electrically connecting C1 as a feedback capacitor across the amplifier for producing on the output terminal a non-inverted sample of the input voltage throughout the second switch state. In an alternate embodiment, an integrable switched capacitor circuit capable of performing an amplitude modulation and/or demodulation function, comprises: an operational amplifier having an input terminal and an output terminal; first and second capacitors C1 and C2; and switch means periodically-sequentially operative in first and second non-overlapping switch states which are closed conditions of switching; operation of said switch means in a first state charging C1 with an input voltage while electrically connecting C2 as a feedback capacitor across the amplifier for causing the latter to produce on the output terminal an inverted sample of the input signal voltage throughout the first switched state; operation of the switch means in a second state charging C2 with the input voltage while electrically connecting C1 as a feedback capacitor across the amplifier for causing the latter to produce on the output terminal a non-inverted sample of the input voltage throughout the second switch state.

DESCRIPTION OF PREFERRED EMBODIMENTS

This invention is described in the paper Switched Capacitor Modem For Amplitude Modulation by Man Shek Lee and Chieh Chang, 1982 IEEE International Synposium on Circuits and Systems Proceedings, Rome, Italy, May 10, 1982, pp. 557-560.

Figure 1:
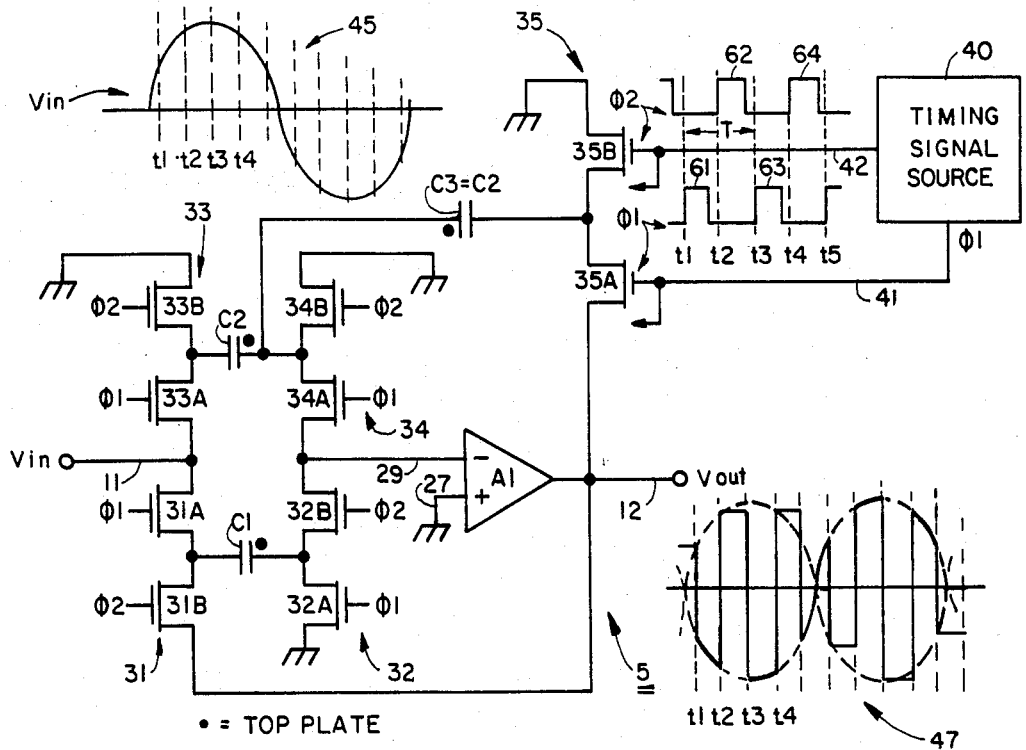
FIG. 1 is a schematic circuit diagram of a circuit 5 embodying this invention and which may operation as a modulator or demodulator.

An integrated modulator circuit 5 in FIG. 1 comprises three integrated capacitors C1, C2 and C3; a single operational amplifier A1; five switch means 31-35; and a timing signal source 40. The dots adjacent one sides of the integrated capacitors indicate the locations of the top plates thereof. The amplifier A1 is a differential input operational amplifier that operates in conjunction with feedback capacitors C1 and C3 as a voltage controlled voltage source having a very high input impedance and a very low output impedance, and providing whatever output current is demanded by external circuitry. The non-inverting input terminal 27 is directly electrically connected to ground for impressing a virtual ground potential on its inverting input terminal 29. The switch means 35 alternately connects the bottom plate of C3 to ground and to the output terminal of a voltage source A1 for rendering the circuit 5 insensitive to bottom plate parasitic capacitance effects of C3. And since the top plate of C3 is directly electrically connected to the top plate of C2, the switch means 34 alternately connects both of these plates to ground and a virtual ground on the non-inverting input terminal 29 for also rendering the circuit insensitive to parasitic capacitance effects associated with these plates. Similarly, the switch means 32 alternately connects the top plate of C1 to ground and the virtual ground potential on line 29 for compensating for top plate parasitic capacitance effects of C1. If the input line 11 is electrically connected to the output terminal of a voltage source (not shown), then the switch means 31 and 33 connect the bottom plates of C1 and C2 to the output terminals of a voltage source or to ground for also rendering the circuit 5 insensitive to any bottom plate parasitic capacitance effects of these integrated capacitors.

In an integrated circuit embodiment of the circuit 5 that is implemented with MOS technology, each of the switch means 31-35 comprises a pair of series-connected MOS FET transistors having gate electrodes that are driven by different ones of a pair of two phase non-overlapping digital timing control signals $\phi 1$ and $\phi 2$ that are produced by a source 40. Switched states in which there are closed conditions of switching of associated FET's occur when timing control signals are positive in FIG. 1. That is, assuming that the switches are turned on by a positive signal pulse, the positive portions of the control signals $\phi 1$ and $\phi 2$ are non-overlapping, although the negative portions of these control signals may overlap. The pair of switching transistors 31A and 31B are connected in series between the input line 11 and the output line 12. The pairs of transistors of the other switch means are connected in series between ground and either the input line 11, the non-inverting input terminal 29, or the output terminal 12. The intermediate terminals between the transistors of each switch means is connected to a side of an associated integrated capacitor. The control signals $\phi 1$ and $\phi 2$ in FIG. 1 are 180° out-of-phase with each other and preferably have substantially a 50% duty cycle. The switching frequency fc of the control signal is fc = 1/T, where T is the period of a switching cycle. These timing control signals are illustrated in in the waveforms $\phi 1$ and $\phi 2$ in the upper right hand corner of FIG. 1.

The operation of a balanced modulator 5 in FIG. 1 will now be considered for a sinusoidal signal voltage 45 on input line 11. The switching transistors 33A, 34A, and 35A are poled by a positive pulse 61 in $\phi 1$ at time t1 for electrically connecting C2 between the input line 11 and inverting terminal 29 and connecting C3 as a feedback or integrating capacitor across the amplifier. This causes A1, C2 and C3 to provide an inverted-continuous version of the input signal 45 in the output voltage signal 47 on line 12. More specifically, the output voltage 47 has an amplitude that varies at the same rate as the input signal, although it is of the opposite sense, when $\phi 1$ is high at this time. This also causes C1 to be charged to the amplitude of the input voltage 45 throughout the pulse 61 in $\phi 1$. When the pulse 61 in $\phi 1$ goes low prior to time t2 for cutting off transistors 31A and 32A, the capacitor C1 samples and holds the charge voltage representation of the input signal voltage that is impressed on it. When $\phi 2$ subsequently goes high at time t2, FET's 33B, 34B and 35B are poled for connecting both sides of C2 and C3 to ground for discharging them. The pulse 62 in $\phi 2$ also causes FET's 31B and 32B to connect the bottom and top plates of C1 to the output terminal 12 and inverting input terminal 29, respectively, i.e., as an integrating capacitor across A1. Since the stored charge on C1 is now fixed to what it was on termination of the pulse 61 in $\phi 1$, this causes A1 to produce a non-inverted sample of the input signal from time t2 in the output signal 47 and for the duration of the pulse 62. This operation is equivalent to alternately multiplying the input signal 45 by $-1$ and $+1$ when C2 and C3 have the same values of capacitance. Consideration of this operation means that when the input voltage is multiplied by $-1$ for $\phi 1$ high then the output signal 47 is a continuous waveform, whereas when the input signal 45 is multiplied by $+1$ for $\phi 2$ high then the output has a sample-hold wave-form.

The frequency spectrum of the output signal 47 is believed to be representable as $$V_o(f) = \tfrac{1}{2}\left[ 1 - \frac{\sin \pi f/(2fc)}{\pi f/(2fc)} \exp(-j\pi f/(2fc)) \right] \quad (1)$$

for $f = fs$, and $$V_o(f) = \tfrac{1}{2}\left[ \frac{-j\sin(n\pi/2)}{n\pi/2} + \frac{\sin(\pi f/2fc)}{\pi f/(2fc)} \exp\left(\frac{-j\pi f}{2fc}\right) \right] \quad (2)$$

for $f = nfc \pm fs$ and; $n = 1, 2, 3 \ldots$; where fs is the frequency of the input signal 45; and fc = 1/T is the modulation or sample frequency of the control signals $\phi 1$ and $\phi 2$. It should be noted that the waveforms $\phi 1$ and $\phi 2$ in FIG. 1 are not drawn to the same scale as the input signal 45 and output signal 47, although timing in all of these waveforms is the same. Reference to equation (2) reveals that even harmonics of the switching frequency fc do contribute to the spectral components of the output signal 47 and may limit the available bandwidth and number of channels. Further consideration of the operation of the modulator in FIG. 1 and equation (2) reveals that although this circuit is insensitive to parasitic capacitance effects associated with the plates of the integrated capacitors, there is a baseband component for input signal leak-through associated with the continous path through C2 and C3 during polling by $\phi 1$. It can be seen that for large fs/fc ratios this leak-through could be substantial. In practice, however, this is not a serious problem since the unwanted spectral components associated with feedthrough can be readily eliminated by merely passing the output signal 47 through an appropriate bandpass filter, as is normally the case in analog signal processing circuitry.

Figure 2:
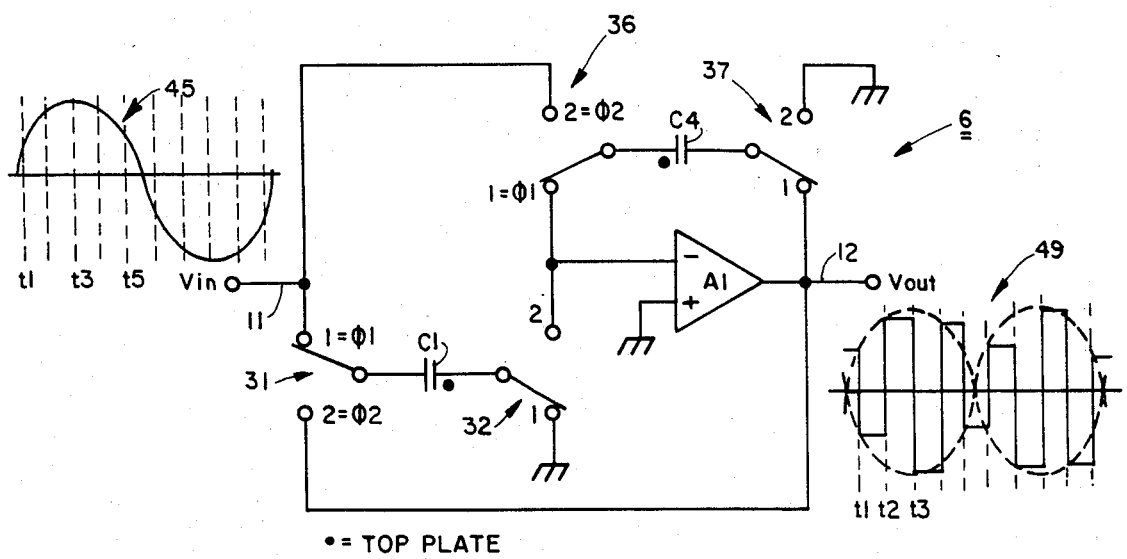
FIG. 2 is a schematic circuit diagram of an alternate embodiment of this invention.

In a preferred embodiment in FIG. 2, an integrated modulator circuit 6 comprises only two integrated capacitors C1 and C4; four switch means 31, 32, 36 and 37, which are illustrated in schematic form; and the operational amplifier A1. The switch means 31 and 32 here operate for connecting C1 in the same manner as in the circuit of FIG. 1. The switch means 36 and 37 operate for alternately connecting C4 between the input line 11 and ground for charging it with the amplitude of the input voltage 45, and across A1 in the opposite polarity that C1 is connected across the amplifier. This means that the input signal voltage 45 is sampled and held in both phases of the timing signal cycle T. This operation of the switch means causes both C1 and C4 to alternately sample and then hold the input voltage in different time slots 61, 62, etc. More specifically, C1 samples the input voltage while C4 holds a sample thereof when $\phi 1$ is high, whereas C1 holds the sample of the input voltage while C4 again samples the input voltage when $\phi 2$ is high. The operation of the switch means in connecting C4 and C1 across A1 in the opposite polarities also causes the circuit 6 to provide inverted and non-inverted samples of the input voltage in the output signal voltage 49 when $\phi 1$ and $\phi 2$, respectively, are high. This is seen in the output signal waveform 49 in FIG. 2.

The frequency spectrum of the output signal voltage 49 is believed to be representable as $$V_o(f) = \frac{\sin(\pi f/2fc)}{\pi f/(2fc)} \exp\left(\frac{-j\pi f}{2fc}\right) \quad (3)$$

where $f = nfc \pm fs$; $n = 1, 3, 5$, etc.; fc is the sampling frequency; and fs is the input signal frequency. Since there is a parasitic capacitance between the top plate of C4 and ground which is not compensated for in the structure of FIG. 2, there may be a baseband component in the output voltage 49. This parasitic capacitance may be compensated with techniques such as are described in the article Compensation For Parasitic Capacitances in Switched-Capacitor Filters by G. C. Temes and R. Gregorian, Electronics Letters, 1979, Vol. 15, pp. 377-379. This circuit 6 is inherently fast, however, since the output of A1 only has to drive the top plate parasitic capacitance of C4 and the input impedance of the next stage. Also, the operation of this circuit 6 as a balanced modulator (in multiplying Vin by −1 and +1) does not depend on the accurate ratio of the capacitances of elements thereof. Additionally, this circuit 6 has particular advantage as a demodulator since the built-in sample-hold functions provide a low pass filtering function that is necessary in a demodulator circuit.

Although this invention is described in relation to preferred embodiments thereof, variations and modifications will occur to those skilled in the art. By way of example, the circuit may be realized with integrated circuit technologies other than MOS, in other than fully integrated circuit form, and fully or partially implemented with discrete components. Also, the switch means may comprise other types of switching elements such as discrete transistors, mechanical switches, relays or other types of integrated switches. And C2 and C3 may have different capacitance values, although the circuit will then no longer provide a balanced output signal, e.g., the input signal is effectively multiplied by +j and −k where j≠k and the ratio C3/C2 determines the value of j or k. Additionally, the duty cycle of the timing control signals may be less than substantially 50%, although it should be maintained less than this value. Further, the circuits in FIGS. 1 and 2 may be operated as either modulators or demodulators. The scope of this invention is therefore to be determined from the appended claims, rather than from the aforementioned descriptions of preferred embodiments thereof.

What is claimed is:

1. An integrable switched capacitor circuit capable of performing amplitude modulation and/or demodulation, comprising:
   an input line adapted for receiving an input signal voltage,
   an operational amplifier having an input terminal and an output terminal,
   first and second capacitors C1 and C2 having one and other sides thereof, and
   switch means associated with said capacitors and being alternately operative in first and second non-overlapping switch states, which are closed conditions of switching; operation of said switch means in the first switch state electrically connecting the one and other sides of C1 to said input line and ground for charging C1 with the input voltage on said input line while electrically connecting the other and one sides of C2 to said input and output terminals for impressing an input signal voltage sample on C2, that is obtained during the preceeding second switch state, across said amplifier for causing the latter to produce on said output terminal an inverted sample of the input signal voltage throughout the first switch state; operation of said switch means in the second switch state electrically connecting the other and one sides of C2 to said input line and ground for charging C2 with the input voltage on said input line while electrically connecting the other and one sides of C1 to said input and output terminals for impressing the input signal voltage sample on C1, that is obtained in the preceeding first switch state, across said amplifier for causing the latter to produce on said output terminal a non-inverted sample of the input signal voltage throughout the second switch state.

2. An integrable switched capacitor circuit for operating as an amplitude modulator and/or as an amplitude demodulator comprising:
   an input line adapted for receiving an analog input signal voltage,
   an operational amplifier having an input terminal and an output terminal,
   first and second capacitors C1 and C2, and
   switch means alternately operative in first and second non-overlapping switch states which are closed conditions of switching; operation of said switch means in the first switch state charging C1 with the input signal voltage on said input line for updating the charge voltage on C1 while connecting C2, with an input signal voltage sample thereon that is obtained during the preceeding switch state, as a feedback capacitor across said amplifier for causing the latter to produce on said output terminal throughout the first switch state an inverted sample of the input signal voltage; operation of said switch means in the second switch state charging C2 with the input voltage on said input line for updating the charge voltage on C2 while connecting C1, with the input signal voltage sample thereon that is obtained during the preceeding switch state, as a feedback capacitor across said amplifier for causing the latter to produce on said output terminal throughout the second switch state a non-inverted sample of the input signal voltage.

3. The circuit according to claim 1 or 2 wherein said switch means is periodically operative in first and second switch states.

4. The circuit according to claim 3 wherein said amplifier has a virtual ground potential on said input terminal and operates in cooperation with said feedback capacitors C1 and C2 as a voltage source.

5. The circuit according to claim 4 wherein said amplifier is a differential input operational amplifier having its non-inverting input terminal electrically connected to ground for impressing a virtual ground potential on its inverting input terminal, which is said input terminal.

6. The circuit according to claim 4 wherein C1 and C2 hold charge stored thereon throughout second and first switch states, respectively, the stored charge on C1 and C2 being reestablished by the input voltage on said input line for each subsequent first and second switch state, respectively.

7. The circuit according to claim 4 wherein C1 and C2 hold charge stored thereon between adjacent first and second switch states, respectively.

8. The circuit according to claim 4 wherein the time intervals of first switch states are equal to the intervals of the second switch states.

9. The circuit according to claim 4 wherein the capacitances of C1 and C2 are the same values.

10. The circuit according to claim 2 wherein said capacitors are integrated capacitors and their one and other sides are the bottom and top plates thereof, respectively.

* * * * *